(12) United States Patent
Baldwin et al.

(10) Patent No.: US 6,402,900 B1
(45) Date of Patent: Jun. 11, 2002

(54) SYSTEM AND METHOD FOR PERFORMING SPUTTER DEPOSITION USING ION SOURCES, TARGETS AND A SUBSTRATE ARRANGED ABOUT THE FACES OF A CUBE

(75) Inventors: David Alan Baldwin, Annadale; Todd Lanier Hylton, Great Falls, both of VA (US)

(73) Assignee: 4 Wave, Inc., Alexandria, VA (US)

( * ) Notice: Subject to any disclaimer, the term of this patent is extended or adjusted under 35 U.S.C. 154(b) by 0 days.

(21) Appl. No.: 09/810,688

(22) Filed: Mar. 16, 2001

(51) Int. Cl.[7] ............................................. C23C 14/34
(52) U.S. Cl. .......................... 204/192.11; 204/298.04; 204/298.26
(58) Field of Search ...................... 204/192.11, 298.04, 204/298.26

(56) References Cited

U.S. PATENT DOCUMENTS

| 5,089,104 A | 2/1992 | Kanda et al. | |
| 5,454,919 A | * 10/1995 | Hill et al. | 204/192.11 |
| 5,962,080 A | * 10/1999 | Tan et al. | 204/192.11 |

* cited by examiner

Primary Examiner—Rodney G. McDonald
Assistant Examiner—Gregg Cantelmo
(74) Attorney, Agent, or Firm—Morgan, Lewis & Bockius LLP

(57) ABSTRACT

A system and method for performing sputter deposition on a substrate. First, second, and third divergent ion current sources generate first, second and third divergent ion beams, respectively. The substrate faces the first ion current source. The first target faces the second ion current source, and the second target faces the third ion current source. The central axis of each ion current source is orthogonal to the central axes of the other two ion current sources.

12 Claims, 2 Drawing Sheets

US 6,402,900 B1

SYSTEM AND METHOD FOR PERFORMING SPUTTER DEPOSITION USING ION SOURCES, TARGETS AND A SUBSTRATE ARRANGED ABOUT THE FACES OF A CUBE

FIELD OF INVENTION

The present invention is directed generally to novel systems and methods for performing sputter deposition, and to optical devices manufactured using such systems and methods.

BACKGROUND OF THE INVENTION

The present invention relates to ion beam sputter deposition (IBSD). More particularly, the present invention concerns a system and method for performing sputter deposition using a divergent ion beam source. It is believed that IBSD is a common technique in the manufacturing of optical filters.

The method is normally carried out in a vacuum environment by bombarding a target with ion current. The bombardment results in the dislodging of atoms from the target which are then deposited as a film on a substrate. IBSD is an improvement over other types of sputter deposition techniques because it produces films of high quality with improved adhesive properties. IBSD produces sputtered films that have a density very similar to the bulk density of the materials used and a surface roughness which is equal to that of a super-polished substrate. these results are advantageous for optical coatings.

Performance of optical filters is further improved with deposition thickness that is uniform across the substrate. The disclosed system and method provide such an improvement.

SUMMARY OF THE INVENTION

The present invention is directed to a system and method for performing sputter position on a substrate. First, second, and third divergent ion current sources generate first, second and third divergent ion beams, respectively. The substrate faces the first ion current source. The first target faces the second ion current source, and the second target faces the third ion current source. The central axis of each ion current source is orthogonal to the central axes of the other two ion current sources.

In one embodiment, the magnitude of the ion current produced by each given ion current source varies throughout the source's respective ion beam in accordance with the equation: ion current=$J_0 \cos(\theta)$; wherein $\theta$ is an angle between the central axis of the given ion current source and a direction of ion current from the given ion current source, and $J_0$ is an ion current density along the central axis of the given ion current source.

In one embodiment, the first and second targets are negatively biased and the substrate rotates during operation of the system. In this embodiment, the central axis of the first ion current source coincides with the axis of rotation of the substrate, which is perpendicular to the surface of the substrate and passes through the substrate at its center. Also in this embodiment, the substrate has a surface which is normal to the central axis of the first ion current source, the first target has a surface which is normal to the central axis of the second ion current source, the second target has a surface which is normal to the central axis of the third ion current source, the central axis of the first ion current source passes through the center of the substrate, the central axis of the second ion current source passes through the center of the first target, and the central axis of the third ion current source passes through the center of the second target.

The present invention is further directed to an optical filter that results from the practice of the disclosed system and method.

BRIEF DESCRIPTION OF THE DRAWINGS

The accompanying drawings, which are incorporated herein and constitute part of this specification, illustrate presently preferred embodiments of the invention, and, together with the general description given above and the detailed description given below, serve to explain features of the invention. In the Drawings.

DETAILED DESCRIPTION OF THE PREFERRED EMBODIMENTS

Figure 1:
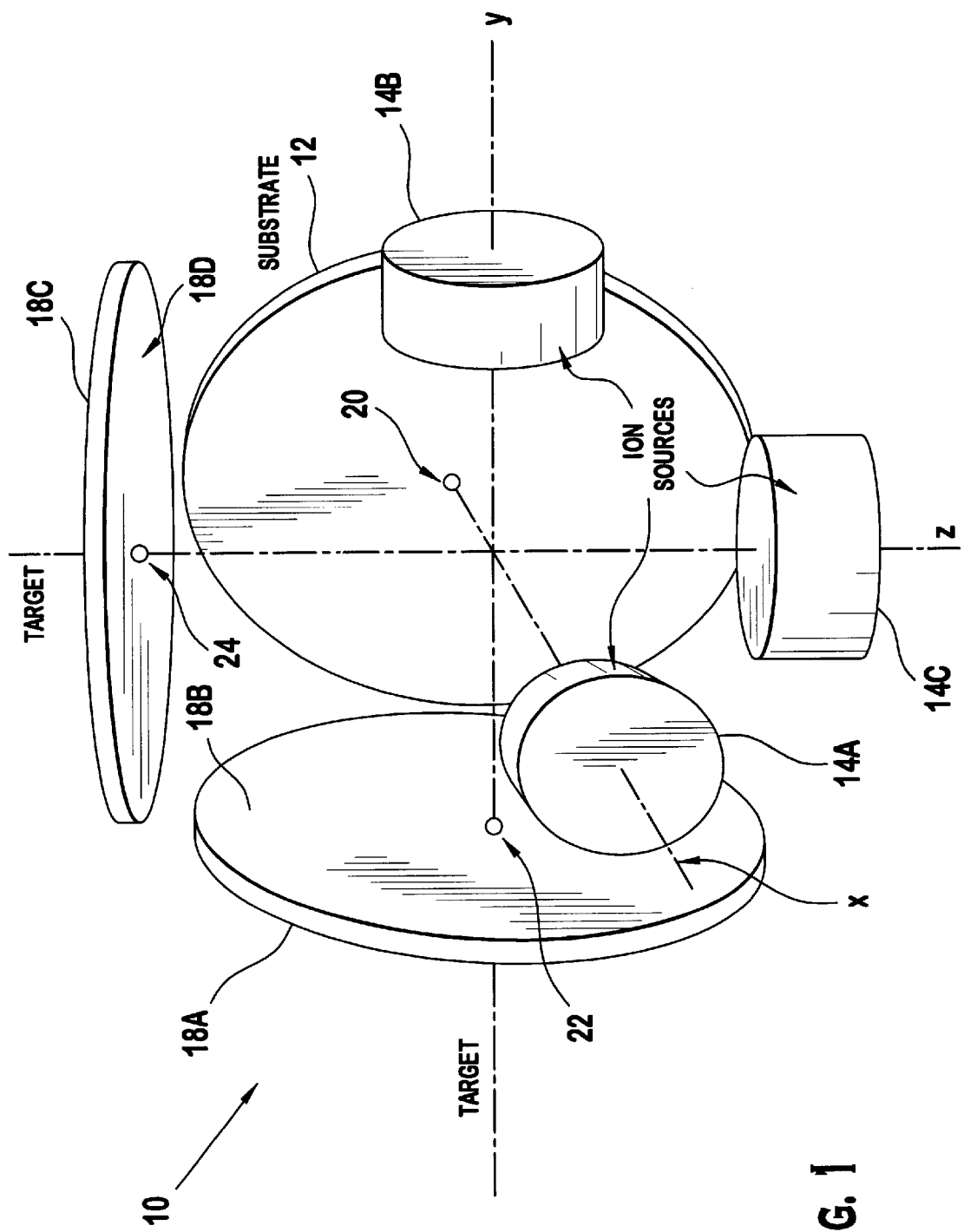
FIG. 1 is a diagram of a system for performing sputter deposition on a substrate using cube geometry according to the present invention.

There is shown on FIG. 1 a system 10 for performing sputter deposition on a substrate 12. The system 10 comprises first, second and third divergent ion current sources 14A, 14B, and 14C respectively [collectively 14]. Ion current sources 14 may be of the Hall-current-type or any ion source with a largely diffusive flux of ions out region of concentrated plasma which are well known in the art. These types of sources are based upon gaseous ionization and are able to provide amperes of charged particle current. Ion source 14 is optionally able to generate its charged particles independently and in the absence of other sources or plasma processes in the vacuum chamber. Each ion source 14 is preferably energized in parallel with the other ion sources 14 using methods well known in the art.

A divergent ion current beam is produced by each ion source 14. The divergent ion current beam from each ion source 14 is characterized by an ion current distribution that varies in accordance with (or approximately in accordance with) the equation: ion current=$J_0 \cos(\theta)$; wherein $\theta$ is an angle between the central axes x, y and z of ion sources 14A, 14B, 14C, respectively, and a direction of ion current from each corresponding ion source 14A, 14B, 14C; and $J_0$ corresponds respectively to the ion current density along the central axis of each corresponding ion current source, 14A, 14B, 14C. The substrate 12 faces the first ion source 14A, and, in the embodiment shown, the substrate 12 has a surface 12A normal to the central axis x of the first ion source 14A. A first target 18A faces the second ion source 14B, and, in the embodiment shown, the first target 18A has a surface normal 18B to the central axis y of the second ion source 14B. A second target 18C faces the third ion source 14C, and, in the embodiment shown, the second target 18C has a surface 18D normal to the central axis z of the third ion source 14C. The central axis of each ion source 14 is orthogonal to the central axes of the other two ion sources. Surfaces 18B, 18D may be substantially planar or, alternatively, spherically concave. System 10 may be advantageously used to improve the uniformity of deposition thickness on substrate 12 and/or 12A.

In one embodiment, the first and second targets 18A and 18C are negatively biased, and substrate 12 is made to rotate (using a motor not shown) about axis x during operation of system 10. Also in this embodiment, the central axis x of ion current source 14A passes through the center 20 of substrate 12, the central axis y of ion current source 14B passes through the center 22 of target 18A, and the central axis z of ion current source 14C passes through the center 24 of target 18C. In an embodiment that is especially advantageous for forming alloys on substrate 12, the first and second targets 18A, 18C are formed from different materials and, as a result, first and second targets 18A, 18C each emit a different material when bombarded with the divergent ion current beams from ion current sources 14B, 14C, respectively.

The present invention also includes a method for performing sputter deposition on a substrate, using system 10. The method comprises generating first, second and third ion current beams from first, second and third divergent ion beam sources 14A, B, and C, respectively The ion current in each given ion beam varies in accordance with the equation: ion current beam current=$J_0 \cos(\theta)$; wherein $\theta$ is an angle between a central axis of the given ion current beam source and a direction of ion current from the given ion current beam source, and $J_0$ is the ion current density along the central axis of the given ion current source. The method further comprises orienting system components as follows: the substrate 12 has a surface that faces the first ion current source 14A; the first target 18A has a surface 18B that faces the second ion current source 14B; the second target 18C has a surface that faces the third ion current source 14C; and the central axis of each ion current source is orthogonal to the central axes of the other two ion current sources. Each ion source 14 is preferably energized in parallel with the other ion sources 14 using methods well known in the art. Additionally, as described above, in one embodiment, the first and second targets 18A and 18C are negatively biased during operation, the central axis x of ion current source 14A passes through the center 20 of substrate 12 and is normal to it, the central axis y of ion current source 14B passes through the center 22 of target 8A and is normal to it, and the central axis z of ion current source 14C passes through the center 24 of target 18C and is normal to it. Ions incident on a given target have gained energy from the target's corresponding ion source and/or target bias and cause sputtering of the target material. Atoms ejected from the targets condense on the substrate to form the growing film.

Figure 2A:
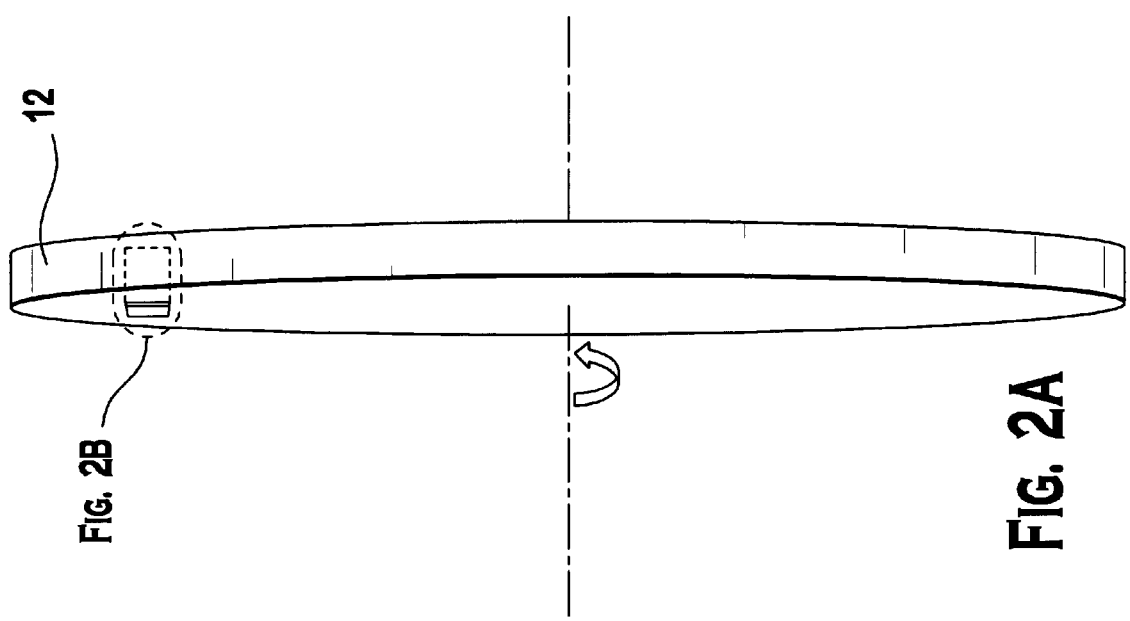
FIGS. 2A and 2B show an exemplary optical filter formed using the system and method of the present invention.
Figure 2B:
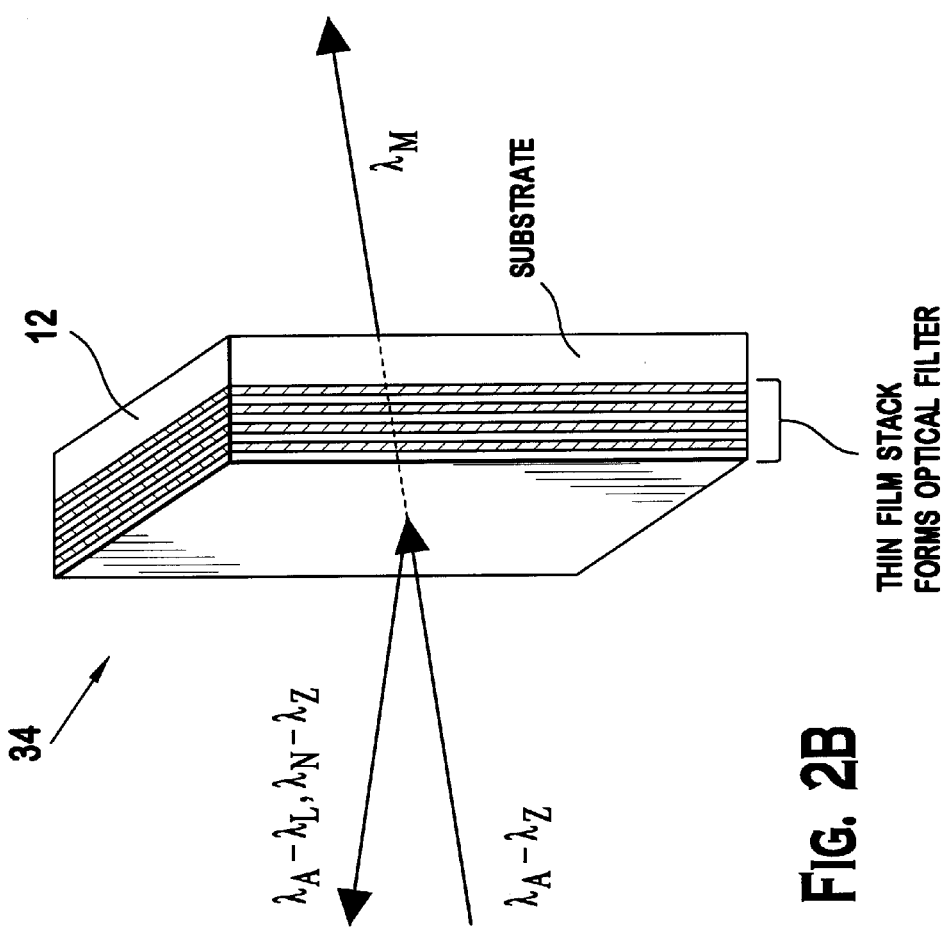

The system and process described above may be advantageously used to create an optical filter 34, as shown in FIGS. 2A, 2B. When the present invention is used to form an optical filter 34, the substrate 12 is preferably formed of a glass wafer, the material deposited on the substrate is alternating layers of tantalum oxide and silicon oxide, and the thickness of the material deposited on the substrate is low-order multiples and/or fractions of the optical thickness at the wavelength of light that the filter will serve to isolate. In forming alloys or alternating layers of material, the system show in FIG. 1 is particularly advantageous, in that it allows different materials to be sputtered simultaneously (or sequentially) during operation of the system. The filter 34 may be used in the form deposited or it may be further processed by sawing, grinding, trimming, back-thinning, polishing, mounting, bonding or other means to incorporate the filter into an optic assembly. It will be evident to practitioners of the art that substrates other than glass may be used, that smaller substrate pieces may be attached to the wafer 12 for deposition of filters on the smaller pieces, that deposited materials other than tantalum oxide and silicon oxide could be used for the filter, as long as the refractive index contrast was sufficiently large, and that a variety of differing film layering designs might be employed to create a filter.

In the embodiment described above, various components and axes are described as being parallel or normal to each other, various axes are described as passing through certain center points, and the distribution of a particular divergent ion beam is described as conforming to a cosine function. It will be understood by those skilled in the art that, such components and axes may be slightly offset from parallel or normal (rather than being precisely parallel or normal), that such axes may pass through points generally proximate the described center points (rather than precisely through the geometric centers described above), and that the distribution of the particular divergent ion beam source described may conform approximately (rather than precisely) to a cosine distribution. Such deviations represent a matter of design choice (e.g., in certain applications requiring less precision greater deviation from the exact geometric limitations described above may be tolerated), and such deviations are within the scope of the present invention.

It will be appreciated by those skilled in the art that changes could be made to the embodiments described above without departing from the broad inventive concept thereof. It is understood, therefore, that this invention is not limited to the particular embodiments disclosed, but is intended to cover modifications within the spirit and scope of the present invention as defined in the appended claims.

What is claimed is:

1. A system for performing sputter deposition on a substrate, comprising:
    (a) first, second and third divergent ion current sources that generate first, second and third divergent ion beams, respectively; wherein each of said first, second and third ion current sources has a corresponding central axis;
    (b) wherein the substrate faces the first ion current source;
    (c) wherein a first target faces the second ion current source;
    (d) wherein a second target faces the third ion current source; and
    (e) wherein the central axis of each ion current source is orthogonal to the central axes of the other two ion current sources.

2. The system of claim 1, wherein the substrate has a surface normal to the central axis of the first ion current source, the substrate has a center and the central axis of the first ion current source passes through the center of the substrate.

3. The system of claim 1, wherein the first target has a surface normal to the central axis of the second ion current source, the first target has a center and the central axis of the second ion current source passes through the center of the first target.

4. The system of claim 1, wherein the second target has a surface normal to the central axis of the third ion current source, the second target has a center and the central axis of the third ion current source passes through the center of the second target.

5. The system of claim 1, wherein the first target is negatively biased.

6. The system of claim 1, wherein the second target is negatively biased.

7. The system of claim 1, wherein the substrate rotates about an axis normal to its surface and located at a center of the substrate during operation of the system.

8. The system of claim 1, wherein the first and second targets each emit a different material when bombarded with the second and third divergent ion beams, respectively.

9. The system of claim 1, wherein an ion current in the first divergent ion beam from the first ion current source varies in accordance with the equation:

$$\text{ion current} = J_0 \cos(\theta);$$

wherein $\theta$ is an angle between the central axis of the first ion current source and a direction of ion current from the first ion current source, and $J_0$ is an ion current density along the central axis of the first ion current source.

10. The system of claim 1, wherein an ion current in the second divergent ion beam from the second ion current source varies in accordance with the equation:

$$\text{ion current} = J_0 \cos(\theta);$$

wherein $\theta$ is an angle between the central axis of the second ion current source and a direction of ion current from the second ion current source, and $J_0$ is an ion current density along the central axis of the second ion current source.

11. The system of claim 1, wherein an ion current in the third divergent ion beam from the third ion current source varies in accordance with the equation:

$$\text{ion current} = J_0 \cos(\theta);$$

wherein $\theta$ is an angle between the central axis of the third ion current source and a direction of ion current from the third ion current source, and $J_0$ is an ion current density along the central axis of the third ion current source.

12. A method for performing sputter deposition on a substrate, the method comprising the steps of:
   (a) generating first, second and third divergent ion beams from first, second and third ion current sources, respectively; wherein each of said first, second and third ion current sources has a corresponding central axis;
   (b) wherein the substrate faces the first ion current source;
   (c) wherein a first target faces the second ion current source;
   (d) wherein a second target faces the third ion current source; and
   (e) wherein the central axis of each ion current beam source is orthogonal to the central axes of the other two ion current sources.

\* \* \* \* \*